(12) United States Patent
Lin et al.

(10) Patent No.: US 8,623,227 B2
(45) Date of Patent: Jan. 7, 2014

(54) TRANSMISSION ELECTRON MICROSCOPE GRID AND METHOD FOR MAKING SAME

(75) Inventors: Xiao-Yang Lin, Beijing (CN); Chen Feng, Beijing (CN); Li-Na Zhang, Beijing (CN); Kai-Li Jiang, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 306 days.

(21) Appl. No.: 13/052,064

(22) Filed: Mar. 19, 2011

(65) Prior Publication Data

US 2012/0006784 A1 Jan. 12, 2012

(30) Foreign Application Priority Data

Jul. 7, 2010 (CN) .......................... 2010 1 0219817

(51) Int. Cl.
*C03C 15/00* (2006.01)
*C03C 25/68* (2006.01)

(52) U.S. Cl.
USPC .................. 216/36; 216/33; 216/7; 428/408; 250/440.11

(58) Field of Classification Search
USPC ............ 720/718; 530/391.1; 445/24; 438/98, 438/694, 597, 53, 409, 261, 20, 19; 429/401, 231.8, 207; 428/701, 688, 428/408, 403, 366, 34.1, 336, 293.7, 156, 428/138, 119; 427/554, 331, 256; 423/448, 423/447.3; 422/90; 381/164; 361/502; 345/75.2, 179; 324/756.03, 754.07, 324/754.03, 693; 313/495; 257/9, 88, 777, 257/659, 416, 40, 330; 252/500; 250/440.11, 326, 311, 201.3; 228/101; 216/36, 33, 20, 13; 174/254; 156/296, 156/250, 155; 136/256

See application file for complete search history.

(56) References Cited

U.S. PATENT DOCUMENTS

| 2008/0237464 | A1   | 10/2008 | Zhang et al. |
| 2009/0291270 | A1 * | 11/2009 | Zettl et al. ................. 428/195.1 |
| 2009/0317926 | A1 * | 12/2009 | Zhang et al. ................... 438/20 |
| 2011/0226413 | A1   | 9/2011  | Zhang et al. |

FOREIGN PATENT DOCUMENTS

| CN | 1433044 A   | 7/2003  |
| CN | 101276724 A | 10/2008 |
| CN | 102194623 A | 9/2011  |
| JP | 2010165907  | 7/2010  |

OTHER PUBLICATIONS

Li et al., Large-Area Synthesis of High-Quality and Uniform Graphene Fils on Copper Foils, Jun. 9009, Science, vol. 324, pp. 1312-1314.*

(Continued)

*Primary Examiner* — Duy Deo
*Assistant Examiner* — Erin Bergner
(74) *Attorney, Agent, or Firm* — Altis Law Group, Inc.

(57) ABSTRACT

The present disclosure relates to a method for making a transmission electron microscope grid. The method includes: (a) providing a substrate with a graphene layer on a surface of the substrate; (b) applying a carbon nanotube film structure to cover the graphene layer; (c) removing the substrate, to obtain a graphene layer-carbon nanotube film composite structure; and (d) placing the graphene layer-carbon nanotube film composite structure on a grid.

18 Claims, 10 Drawing Sheets

(56) References Cited

OTHER PUBLICATIONS

Tung et al. Low-Temperature Solution processing of Graphene-Carbon Nanotube Hybrid Materials for High-Performance Transparent Conductors, Nano Letters, vol. 9, No. 5, 2009, pp. 1949-1955.*

Jannik C. Meyer, C. O. Girit, M. F. Crommie, A. Zettl, Imaging and dynamics of light atoms and molecules on graphene, Nature, Jul. 17, 2008, pp. 319-322, vol. 454.

Jannik C. Meyer, C. Kisielowski, R. Erni, Marta D. Rossell, M. F. Crommie, A. Zettl, Direct Imaging of Lattice Atoms and Topological Defects in Graphene Membranes, NANO Letters, Jun. 19, 2008, pp. 3582-3586, vol. 8, No. 11.

Yang Guang et al. Preparation of Carbon Film and Its Application in Nanometer Powders Observation. Analysis and Testing Technology and Instruments. Mar. 1998, pp. 26-28, vol. 4, No. 1,CN.

* cited by examiner

US 8,623,227 B2

TRANSMISSION ELECTRON MICROSCOPE GRID AND METHOD FOR MAKING SAME

CROSS-REFERENCE TO RELATED APPLICATIONS

This application claims all benefits accruing under 35 U.S.C. §119 from China Patent Application No. 201010219817.X, filed on Jul. 7, 2010 in the China Intellectual Property Office, the disclosure of which is incorporated herein by reference.

BACKGROUND

1. Technical Field

The present disclosure relates to a transmission electron microscope grid, and a method for making the transmission electron microscope grid.

2. Description of Related Art

Transmission electron microscopy is one of the most important techniques for the detailed examination and analysis of materials having small size. Transmission electron microscopy provides high-resolution imaging and material analysis of thin specimens. In transmission electron microscopy analysis, a transmission electron microscope (TEM) grid is used to support the specimens. The conventional TEM grid includes a metal grid such as a copper or nickel grid, a porous organic membrane covering on the metal grid, and an amorphous carbon film deposited on the porous organic membrane. However, in practical application, when a size of the specimen is less than a thickness of the supporting film, the amorphous carbon film induces high noise in the transmission electron microscopy imaging.

What is needed, therefore, is to provide a TEM grid and a method for making the TEM grid, to overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
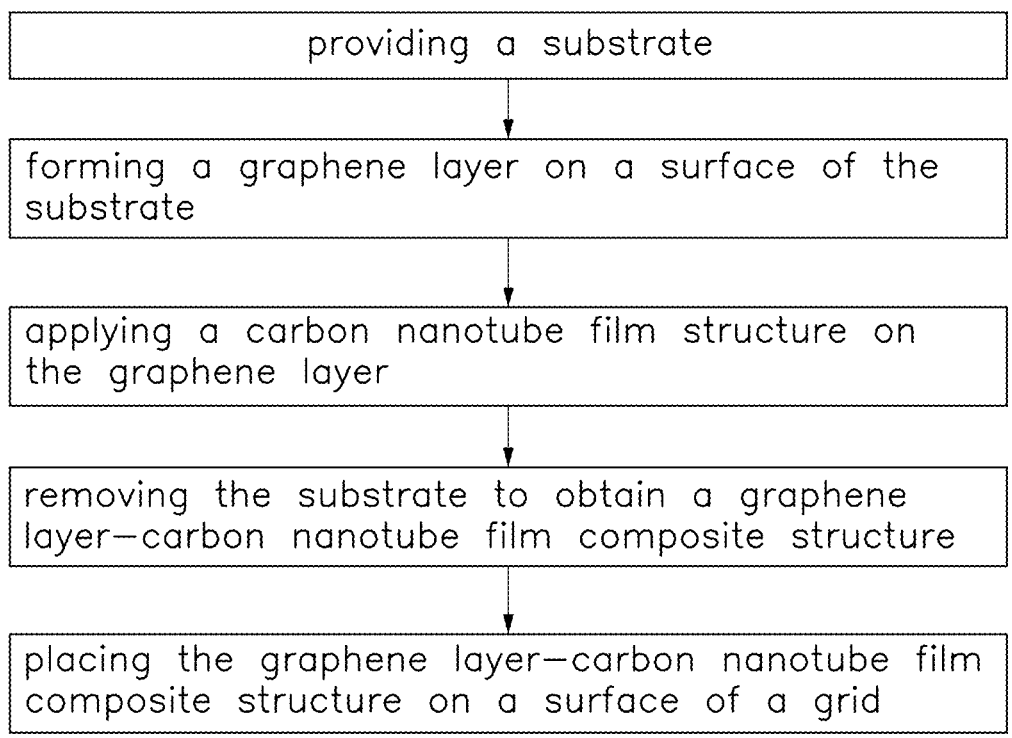
FIG. 1 shows a flow chart of one embodiment of a method for making a TEM grid.

Referring to FIG. 1, a method for making a TEM grid of one embodiment can include the following steps:

(a) providing a substrate;
(b) forming a graphene layer on a surface of the substrate;
(c) applying a carbon nanotube film structure on the graphene layer;
(d) removing the substrate to obtain a graphene layer-carbon nanotube film composite structure; and
(e) placing the graphene layer-carbon nanotube film composite structure on a surface of a grid.

In step (a), the substrate acts as a carrier for forming the graphene layer thereon. The substrate can be a metal foil, a copper foil, an alloy foil, or a metallic oxide foil. In one embodiment, the substrate is a copper foil.

In step (b), the graphene layer can be formed on a surface of the substrate by a low pressure chemical vapor deposition technology. The graphene layer can include a single layer of graphene or a plurality of layers of graphene. If the graphene layer includes a plurality of layers of graphene, the plurality of layers of graphene are stacked with each other. The graphene layer can be a continuous integrated structure. The term "continuous integrated structure" can be defined as a structure that is combined by a plurality of chemical bonds (e.g., $sp^2$ bonds, $sp^1$ bonds, or $sp^3$ bonds) to form an overall structure. The shape of the graphene layer can be round, square, rectangular, oval, or other shapes. In one embodiment, the graphene layer includes one to three layers of graphene stacked with each other, and the shape of the graphene layer is round with a diameter from about 3 millimeters to about 2 centimeters.

In step (c), the carbon nanotube film structure includes at least two stacked carbon nanotube films. The carbon nanotube film includes a plurality of carbon nanotubes aligned substantially along the same direction. An alignment direction of the carbon nanotube film is substantially paralleled to the alignment direction of the plurality of carbon nanotubes. The adjacent carbon nanotube films in the carbon nanotube film structure can align along different directions with an angle α therebetween. The carbon nanotubes in the carbon nanotube film are aligned substantially along the same direction. In the carbon nanotube film structure, the length directions of the carbon nanotubes in different carbon nanotube films can intersect with each other. The carbon nanotube film can be drawn from a carbon nanotube array.

A method for making the carbon nanotube film includes: (c11) providing the carbon nanotube array capable of having a film drawn therefrom; and (c12) pulling/drawing out the carbon nanotube film from the carbon nanotube array. The pulling/drawing can be done by using a tool (e.g., adhesive tape, pliers, tweezers, or another tool allowing multiple carbon nanotubes to be gripped and pulled simultaneously).

In step (c11), the carbon nanotube array can be formed by a chemical vapor deposition (CVD) method. The carbon nanotube array includes a plurality of carbon nanotubes parallel to each other and approximately perpendicular to the substrate. The carbon nanotubes in the carbon nanotube array are closely packed together by van der Waals force. The carbon nanotubes in the carbon nanotube array can be single-walled carbon nanotubes, double-walled carbon nanotubes, multi-walled carbon nanotubes, or combinations thereof. The diameter of the carbon nanotubes can be in the range from about 0.5 nanometers to about 50 nanometers. The height of the carbon nanotubes can be in the range from about 50 nanometers to 5 millimeters. In one embodiment, the height of the carbon nanotubes can be in a range from about 100 microns to 900 microns.

In step (c12), the carbon nanotube film includes a plurality of carbon nanotubes, and there are interspaces between adjacent two carbon nanotubes. Carbon nanotubes in the carbon nanotube film can be substantially parallel to a surface of the carbon nanotube film. A distance between adjacent two carbon nanotubes can be larger than a diameter of the carbon nanotubes. The carbon nanotube film can be pulled/drawn by the following substeps: (c121) selecting a carbon nanotube segment having a predetermined width from the carbon nanotube array; and (c122) pulling the carbon nanotube segment at an even/uniform speed to achieve a uniform drawn carbon nanotube film.

In step (c121), the carbon nanotube segment having a predetermined width can be selected by using an adhesive tape such as the tool to contact the carbon nanotube array. The carbon nanotube segment includes a plurality of carbon nanotubes parallel to each other. In step (c122), the pulling direction is substantially perpendicular to a growing direction of the carbon nanotube array.

Figure 2:
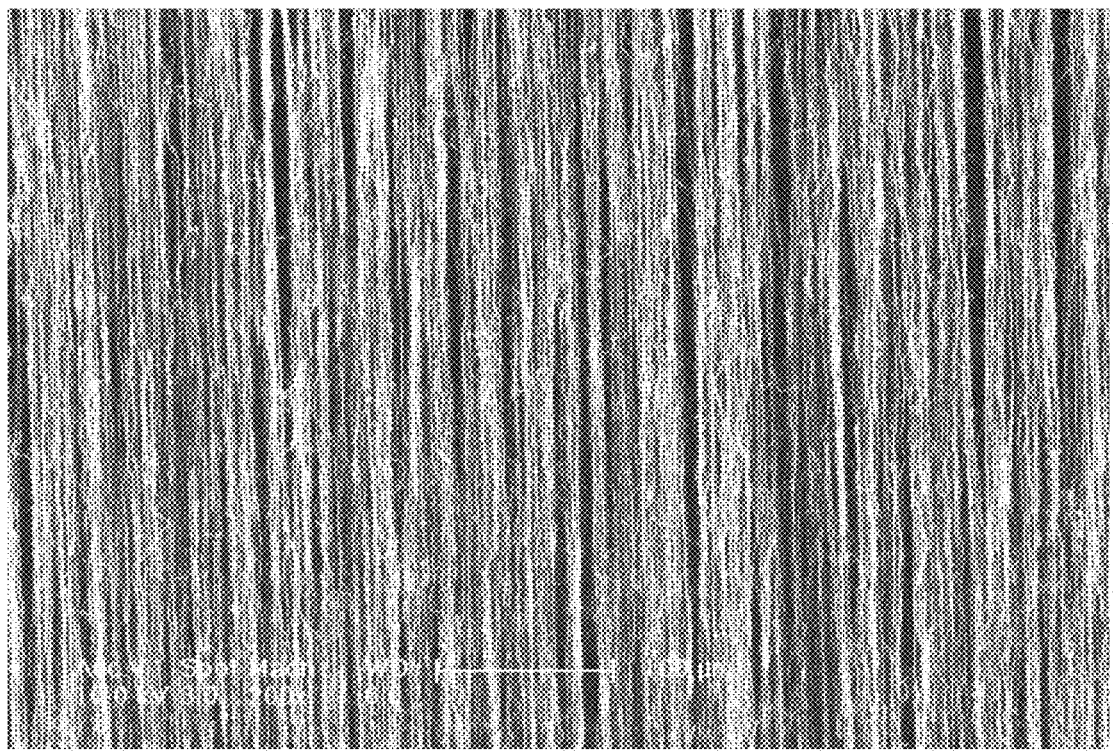
FIG. 2 shows a Scanning Electron Microscope (SEM) image of a carbon nanotube film.

More specifically, during the pulling process, as the initial carbon nanotube segment is drawn out, other carbon nanotube segments are also drawn out end-to-end due to the van der Waals force between the ends of the adjacent segments. This process of drawing ensures that a continuous, uniform carbon nanotube film having a predetermined width can be formed. Referring to FIG. 2, the carbon nanotube film includes a plurality of carbon nanotubes joined end-to-end. The carbon nanotubes in the carbon nanotube film are parallel to the pulling/drawing direction of the drawn carbon nanotube film, and the carbon nanotube film produced in such manner can be selectively formed to have a predetermined width. The carbon nanotubes in the carbon nanotube film are joined end-to-end by van der Waals force therebetween to form a free-standing film. By 'free-standing', it is meant that the carbon nanotube structure does not have to be supported by a substrate and can sustain its own weight when it is hoisted by a portion thereof without tearing. In the carbon nanotube film, the adjacent two carbon nanotubes side by side may be in contact with each other or spaced apart from each other. Pores are defined in the carbon nanotube film by adjacent carbon nanotubes.

Figure 3:
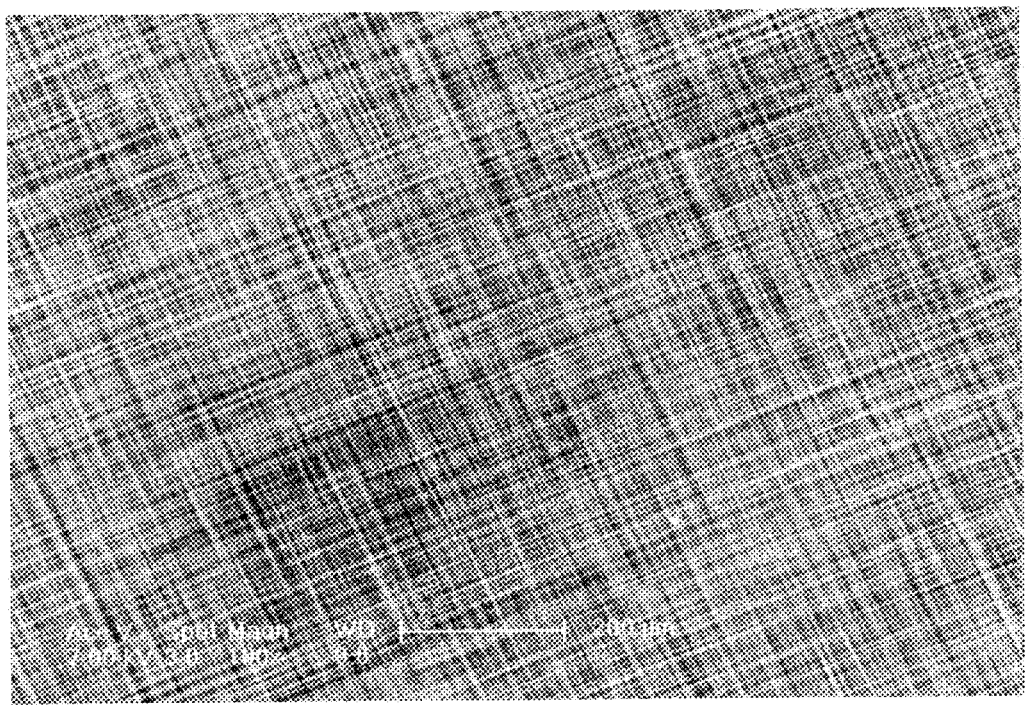
FIG. 3 shows an SEM image of a carbon nanotube film structure including a plurality of stacked carbon nanotube films.

Referring to FIG. 3, in step (c), at least two carbon nanotube films are stacked with each other along different directions with an angle α therebetween. A frame can be provided, and a first carbon nanotube film can be secured to the frame. One or more edges of the carbon nanotube film are attached to the frame, and other parts of the carbon nanotube film are suspended within the frame. A second carbon nanotube film can be placed on the first carbon nanotube film along another direction. By using the same manner, more than two carbon nanotube films can be stacked with each other on the frame. The carbon nanotube films can be respectively aligned along different directions, and can also be aligned along just two directions. The carbon nanotube film structure is a free-standing structure.

Adjacent carbon nanotube films can be combined only by the van der Waals force therebetween, and a more stable carbon nanotube film structure is formed. The carbon nanotube film has an extremely large specific surface area, and is very sticky. The layer number of the carbon nanotube films in the carbon nanotube film structure is not limited. In one embodiment, the carbon nanotube film structure is two layers of carbon nanotube films. The angle α between the orientations of carbon nanotubes in the two carbon nanotube films aligned along different directions can be in a range from about 0 degree to about 90 degrees. In one embodiment, the angle α is about 90 degrees.

If the carbon nanotube film structure is formed, step (c) further includes a step (c2) of covering the graphene layer on the substrate with the carbon nanotube film structure. Due to a stickiness of the carbon nanotube film structure, when the graphene layer is covered with the carbon nanotube film structure, the carbon nanotube film structure can adhere to the graphene layer firmly.

After covering the carbon nanotube film structure on the graphene layer of the substrate, step (c) can further include an optional step (f) of treating the carbon nanotube film structure on the graphene layer of the substrate with an organic solvent. After the organic solvent is applied to the carbon nanotube film structure on the graphene layer of the substrate. The organic solvent can be evaporated from the carbon nanotube film structure, to enlarge the pores defined between adjacent carbon nanotubes in the carbon nanotube film structure and make the carbon nanotube film structure and the graphene layer adhere to each other more firmly. The organic solvent can be volatile at room temperature and can be ethanol, methanol, acetone, dichloroethane, chloroform, or any combination thereof. In one embodiment, the organic solvent is ethanol. The organic solvent should have a desirable wettability relative to the carbon nanotubes. The step (f) of applying the organic solvent to the carbon nanotube film structure on the graphene layer of the substrate, may include a step of dropping the organic solvent on a surface of the carbon nanotube film structure, with a dropper. Alternatively, immersing the entire carbon nanotube film structure on the graphene layer of the substrate into a container with the organic solvent therein may be employed. After the organic solvent is evaporated, the adjacent parallel carbon nanotubes in the carbon nanotube film will bundle together and the carbon nanotube film will adhere to the graphene layer more firmly, due to the surface tension of the organic solvent when the organic solvent volatilizes. The bundling will create substantially parallel and spaced carbon nanotube strings. The bundling will occur in a microscopic view, and the carbon nanotube film structure will sustain the film shape in a macroscopic view. The carbon nanotube strings also include a plurality of carbon nanotubes joined end-to-end by Van der Waals force therebetween. Due to the carbon nanotube films being aligned along different directions, the carbon nanotubes of different films shrink to form from carbon nanotube strings in different directions. The carbon nanotube strings intersect with each other and form larger pores. The size of the pores can range from about 1 nanometer to about 10 microns. In one embodiment, the size of the pores ranges from about 100 nanometers to about 1 micron. The more layers of carbon nanotube films, the smaller the size of the pores in the carbon nanotube film structure. Thus, by adjusting the number of the carbon nanotube films in the carbon nanotube structure, the desired size of the pores can be achieved. The step of treating the carbon nanotube film structure with the organic solvent is optional.

In step (d), the graphene layer-carbon nanotube film composite structure can be obtained by immersing the substrate with the carbon nanotube film structure on the graphene layer into a treatment fluid filled in a container. The treatment fluid is not limited, provided the treatment fluid can react with the substrate, and will not erode the graphene layer-carbon nanotube film composite structure. Thus, if the substrate with the carbon nanotube film structure on the graphene layer is immersed in the treatment fluid for a determined time, the substrate can be removed. Alternatively, due to the carbon nanotube film structure being a free-standing structure, the carbon nanotube film structure can act as a carrier for supporting the graphene layer, and prevent the continuous integrated structure of the graphene layer from being destroyed. Generally, the treatment fluid can be acid solution, alkali solution, or salt solution. Furthermore, during the reaction between the treatment fluid and the substrate, a plurality of solid impurities can be formed on the graphene layer-carbon nanotube film composite structure.

In one embodiment, the treatment fluid is ferric chloride solution. If the substrate is the copper foil, the ferric chloride solution can react with the copper foil substrate to remove the copper foil. The step of removing the copper foil includes a step of immersing the substrate with the carbon nanotube film structure on the graphene layer into a ferric chloride solution having a concentration of 0.5 g/ml for about 24 hours. Alternatively, the reaction time can be determined by the thickness of the substrate and the concentration of the treatment fluid.

If some solid impurities are deposited on the graphene layer-carbon nanotube film composite structure, step (d) can further include an optional step (g) of cleaning the graphene layer-carbon nanotube film composite structure with a cleaning liquid. The cleaning liquid can be an acid solution. The acid solution can be dilute sulfuric acid, dilute nitric acid, dilute hydrochloric acid, or any combination thereof. In one embodiment, the cleaning liquid is dilute hydrochloric acid. The step of applying the cleaning liquid on the graphene layer-carbon nanotube film composite structure can include a step of immersing the entire graphene layer-carbon nanotube film composite structure into the cleaning liquid filled in a container for about 1 minute to about 15 minutes. The cleaning liquid can wash away the plurality of solid impurities deposited on the graphene layer-carbon nanotube film composite structure. Furthermore, the step (g) can further include an optional step of (h) applying a de-ionized water to wash away the cleaning liquid in the graphene layer-carbon nanotube film composite structure. Steps (g) and (h) are optional.

In step (d), the graphene layer and the carbon nanotube film structure are joined by van der Waals force. To join the graphene layer with the carbon nanotube by chemical bonds, step (d) can further includes an optional step (i) of irradiating the graphene layer-carbon nanotube film composite structure with a laser or an ultraviolet beam, or bombarding the graphene layer-carbon nanotube film composite structure with high-energy particles. In step (i), the graphene layer and the carbon nanotube film structure can be joined by a plurality of $sp^3$ bonds, thus, the graphene layer can be fixed on the surface of the carbon nanotube film structure firmly.

Step (d) can include an optional step (j) of covering another carbon nanotube film structure on the surface of the graphene layer away from the carbon nanotube film structure. Thus, the graphene layer can be sandwiched between the two carbon nanotube film structures to form a sandwich structure. In other embodiments, another carbon nanotube film structure can include one or more carbon nanotube films having a different or the same structure with the original carbon nanotube film structure. If the sandwich structure is obtained, step (j) can further include an optional step (k) of treating the sandwich structure with an organic solvent.

In step (e), a surface of the carbon nanotube film structure away from the graphene layer is in contact with the grid, thus, the carbon nanotube film structure can be sandwiched between the graphene layer and the grid. The grid can include at least one through hole. The at least one through hole is covered by the graphene layer-carbon nanotube film composite structure. The graphene layer-carbon nanotube film composite structure is suspended above the entire through hole. Each of the through holes has a diameter from about 10 microns to about 2 millimeters. The diameter of each through hole can be larger than the size of the pores in the carbon nanotube film structure. The grid can be made of metal, alloy, or ceramics. In one embodiment, the grid is a copper grid.

If the area of the graphene layer-carbon nanotube film composite structure is larger than the area of the grid, step (e) can be replaced with step (e'). Step (e') includes the following steps: arranging a plurality of grids spaced from each other on a platform; covering the plurality of grids with one graphene layer-carbon nanotube film composite structure; and cutting the graphene layer-carbon nanotube film composite structure corresponding to the plurality of grids, resulting in a plurality of TEM grids can be obtained at one time. To cut the graphene layer-carbon nanotube film composite structure corresponding to the grids, a laser beam can be provided to focus the graphene layer-carbon nanotube film composite structure between two adjacent grids. The graphene layer-carbon nanotube film composite structure between two adjacent grids irradiated by the laser beam can be burned away. The laser beam can have a power of about 5 watts to 30 watts (e.g., about 18 watts).

Step (e) can further include an optional step (l) of treating the graphene layer-carbon nanotube film composite structure on the grid with an organic solvent to adhere the graphene layer-carbon nanotube film composite structure with the grid more tightly. The contact surface between the carbon nanotube film structure and the grid can be increased if the organic solvent treats the graphene layer-carbon nanotube film composite structure on the grid. Thus, the carbon nanotube film structure can be adhered to the surface of the grid more firmly. The organic solvent can be volatile at room temperature, and can be ethanol, methanol, acetone, dichloroethane, chloroform, or any combination thereof. In one embodiment, the organic solvent is ethanol. The organic solvent should have a desirable wettability to the carbon nanotubes. In this embodiment, step (l) can include a step of applying the organic solvent on the surface of the graphene layer-carbon nanotube film composite structure by dropping the organic solvent from a dropper; or immersing the entire graphene layer-carbon nanotube film composite structure into an organic solvent filled in a container.

The excess portion of the graphene layer-carbon nanotube film composite structure not in contact with the grid can be removed by using a laser beam. The laser beam can focus on the excess portion of the graphene layer-carbon nanotube film composite structure not in contact with the grid to remove the excess portion of the graphene layer-carbon nanotube film composite structure.

The method for making the TEM grid can have at least the following advantages. First, the carbon nanotube film and the carbon nanotube film structure formed from the carbon nanotube film are free-standing and sticky. The carbon nanotube film and the carbon nanotube film structure can act as a carrier for supporting the graphene layer without destroying the entire structure of the graphene layer. Therefore, a large size (centimeter-sized) graphene layer on one surface of carbon nanotube film structure can be obtained. Further, the graphene layer-carbon nanotube film composite structure can be formed in a solution, and the impurity can be easily cleaned up by adding a cleaning liquid. Second, by using the laser, ultraviolet, or high-energy particles to treat the graphene layer-carbon nanotube film composite structure, the graphene layer and the carbon nanotube film structure can be combined firmly through chemical bonds. Third, the carbon nanotube film structure has a large specific surface area, and is sticky. Therefore, the carbon nanotube film structure can be directly adhered on the surface of the grid. Further, an organic solvent can treat the graphene layer-carbon nanotube film composite structure on the grid. Thus, the carbon nanotube film structure can be firmly secured to the grid. Fourth, a plurality of grids can be covered by a graphene layer-carbon nanotube film composite structure, to form a plurality of TEM grids at one time.

Referring to FIGS. 4, 5, 6, and 7, a TEM grid 100, which can be made by the above described method, includes a grid 110 and a graphene layer-carbon nanotube film composite structure 120 covered on the grid 110.

Figure 4:
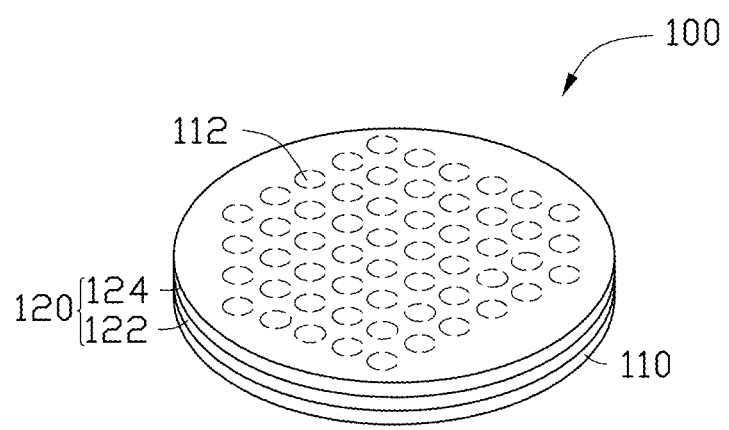
FIG. 4 shows a schematic view of one embodiment of a TEM grid.

Referring to FIG. 4, the grid 110 is a layer with one or more through holes 112 therein. The grid 110 can be used in a conventional TEM grid. The material of the grid 110 can be Cu, Ni, or other suitable metal materials. In one embodiment, the material of the grid 110 is copper. The graphene layer-carbon nanotube film composite structure 120 is located on the grid 110, thus, the portions of graphene layer-carbon nanotube film composite structure 120 can be suspended across the through holes 112. In one embodiment, an area of the graphene layer-carbon nanotube film composite structure 120 is equal to an area of the grid 110. The entire surface of the grid 110 can be covered by the graphene layer-carbon nanotube film composite structure 120. A diameter of the through holes 112 is in the range from about 10 microns to about 2 millimeters. The through holes 112 of the grid 110 can be made by a chemical erosion technology.

Figure 5:
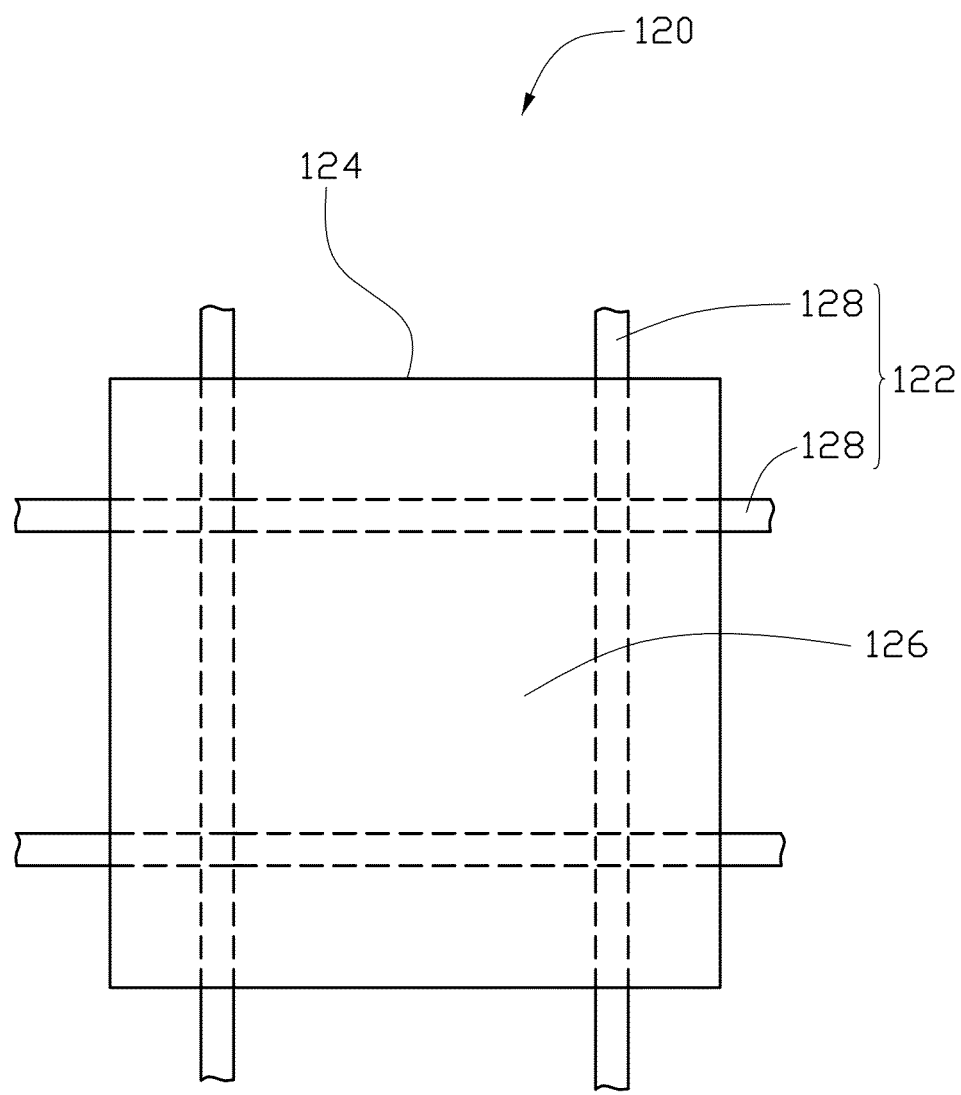
FIG. 5 shows a schematic view of one embodiment of a graphene layer-carbon nanotube film composite structure.

Referring to FIG. 5, the graphene layer-carbon nanotube film composite structure 120 includes at least one carbon nanotube film structure 122 and a graphene layer 124 disposed on a surface of the carbon nanotube film structure 122. The carbon nanotube film structure 122 includes a plurality of pores 126, and the pores 126 are covered by the graphene layer 124. The pores 126 in the carbon nanotube film structure 122 have a size smaller than the diameter of the through holes 112 in the grid 110.

More specifically, referring to FIGS. 2 and 3, the carbon nanotube film structure 122 includes at least two carbon nanotube films stacked on each other. The carbon nanotube film can be drawn from the carbon nanotube array. The carbon nanotube array includes a plurality of carbon nanotubes aligned substantially along the same direction and parallel to a surface of the carbon nanotube film. The carbon nanotubes in the carbon nanotube film are joined end-to-end by van der Waals force therebetween. In the carbon nanotube film structure, some of the carbon nanotube films are aligned along different directions. An angle α exists between the orientation of carbon nanotubes in the two carbon nanotube films. The angle α is in the range of $0°<α≤90°$. In one embodiment, α is equal to about 90 degrees.

Figure 6:
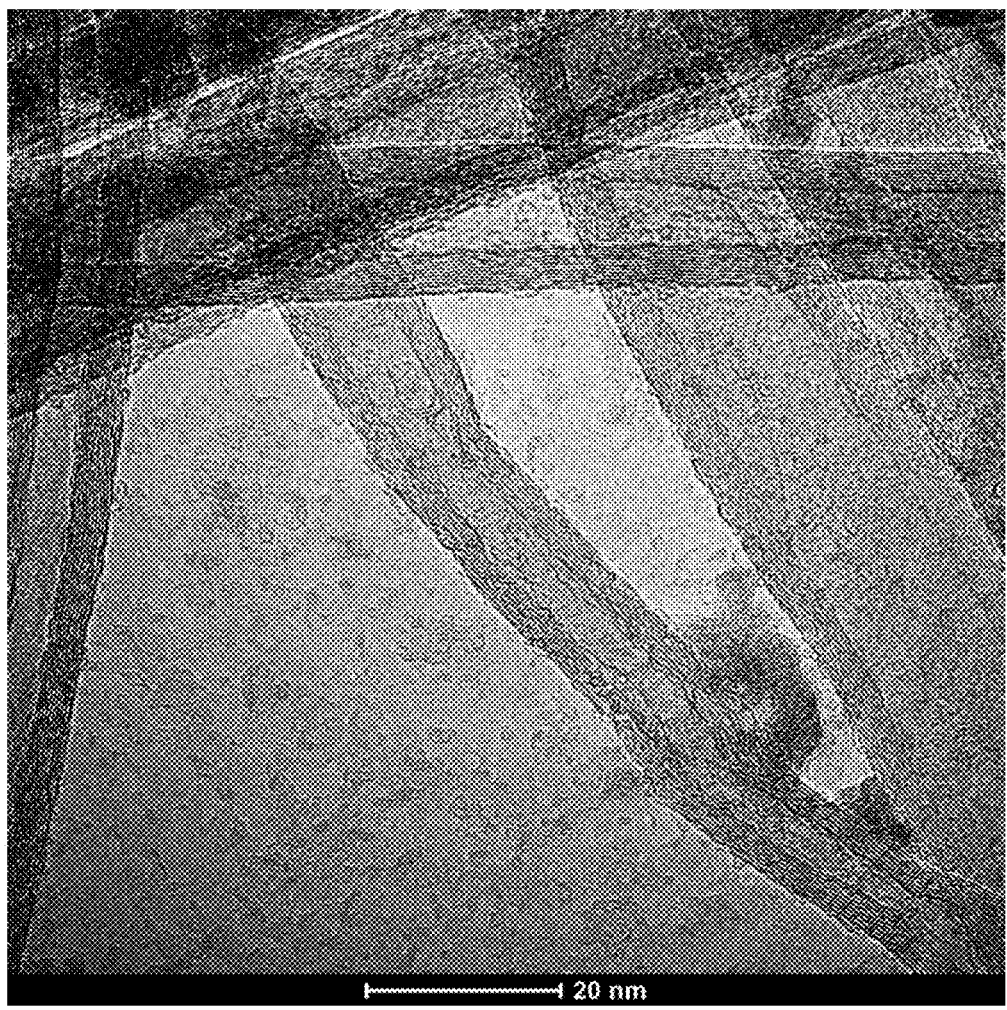
FIG. 6 shows a TEM image of one embodiment of graphene layer-carbon nanotube film composite structure.

Referring to FIGS. 5 and 6, the carbon nanotube film includes a plurality of carbon nanotube strings 128 intersecting with each other. The carbon nanotube string 128 includes a plurality of carbon nanotubes substantially parallel to each other. The carbon nanotube string 128 includes a plurality of carbon nanotubes joined end-to-end by van der Waals force therebetween. A plurality of pores 126 are defined by the intersecting carbon nanotube strings 128. The size of the pores 126 is related to the number of layers of the carbon nanotube films in the carbon nanotube film structure 122. The number of layers of carbon nanotube films is not limited. In one embodiment, the carbon nanotube film structure 122 includes 2 to 4 layers of carbon nanotube films. The size of the pores can be in the range from about 1 nanometer to 1 micron.

The graphene layer 124 is a continuous integrated structure. The graphene layer 124 can cover the entire carbon nanotube film structure 122. If the entire carbon nanotube film structure 122 is covered by the graphene layer 124, all the pores 126 in the carbon nanotube film structure 122 can be covered by the graphene layer 124. The graphene layer 124 can include a single layer of graphene or a plurality of layers of graphene. In one embodiment, the graphene layer 124 includes 1 layer to 3 layers of graphene.

Furthermore, a plurality of $sp^3$ bonds can join the graphene layer 124 and the carbon nanotube film structure 122 together.

Figure 7:
FIG. 7 shows a high resolution TEM image of a nano-scaled gold particle on an embodiment of the TEM grid.
Figure 8:
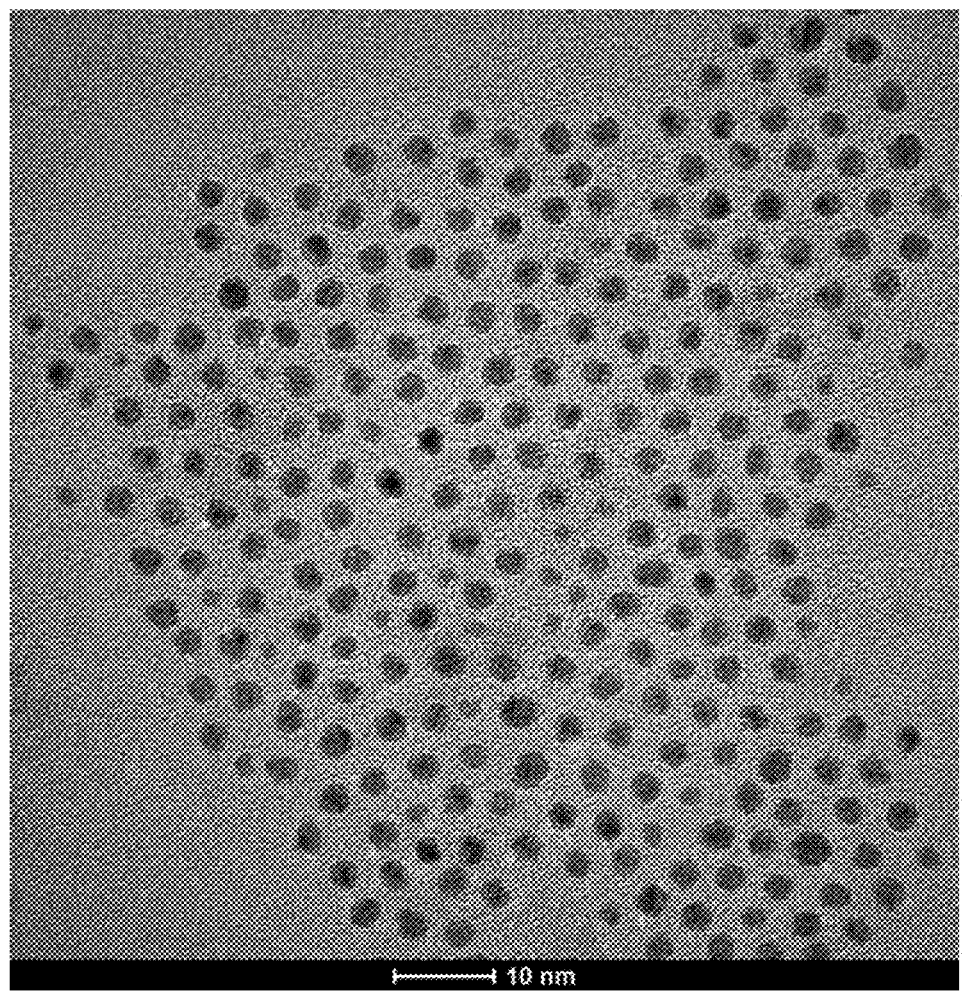
FIG. 8 shows a high resolution TEM image of a plurality of nano-scaled gold particles on another embodiment of the TEM grid.

In use of the TEM grid 100, a specimen can be disposed on a surface of the TEM grid 100. More specifically, a plurality of specimens can be disposed on the surface of the graphene layer 124 covering the pore 126 of the carbon nanotube film structure 122. The specimens can be nano-scaled particles, such as nanowires, nanotubes, or nanoballs. The size of a single specimen can be smaller than 1 micron. In one embodiment, the size of the single specimen can be smaller than 10 nanometers. Referring to FIGS. 7 and 8, the specimen is an amount of nano-scaled gold powder. The nano-scaled gold powder can be dispersed in a solvent, and then, can be dropped on the surface of the TEM grid 100. The solvent is dried, and TEM photos with different resolutions can be achieved. The black spots in FIGS. 7 and 8 are the gold powder.

The TEM grid 100 has at least the following advantages. First, the graphene layer 124 carries the specimen. A large amount of specimens can be uniformly distributed on the surface of the graphene layer 124. The TEM photo can be used to analyze the size distribution of the specimens, and observe the self-assembling of the large amount of specimens on the surface of the graphene layer 124. The graphene layer 124 covers the pore 126, the graphene layer 124 carries the specimens, and thus, the specimens are uniformly distributed above the pore 126, thereby increasing the carrying probability of the specimens. Alternatively, the size of the single specimen can be only a little smaller than the size of the pore 126.

Second, the graphene layer 124 can cover all the pores 126 of the carbon nanotubes film structure, thereby, to achieve a maximum carrying probability of the specimens.

Third, the graphene layer is very thin. The graphene has a thickness of about 0.335 nanometers. Therefore, the background noise during the TEM observation can be lowered, and the TEM photos having higher resolution can be achieved.

Fourth, due to a high purity of the carbon nanotube film drawn from the carbon nanotube array, the TEM grid 100, including the carbon nanotube films, does not require elimination of impurities by using additional treating step.

Furthermore, the carbon nanotube film structure 122 and the graphene layer 124 are both composed of carbon atoms, and have a similar structure (graphene) and properties. Therefore, the carbon nanotube film structure 122 can be joined together with the graphene layer 124 by $sp^3$ bonds. The TEM grid 100 including the $sp^3$ bonds can be more durable.

Figure 9:
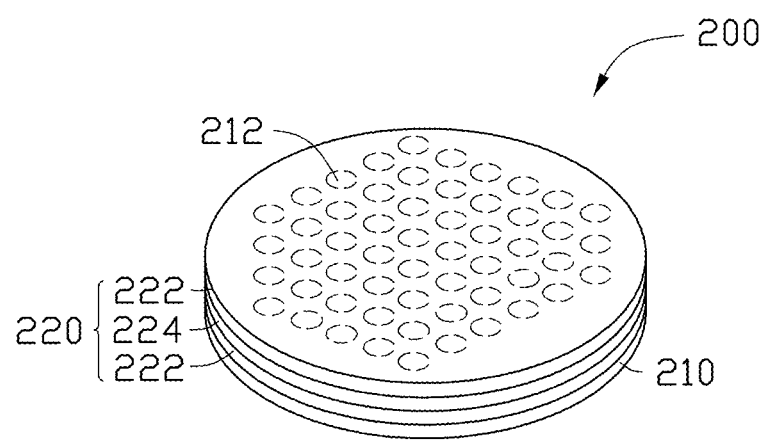
FIG. 9 shows a schematic view of one embodiment of a TEM grid.
Figure 10:
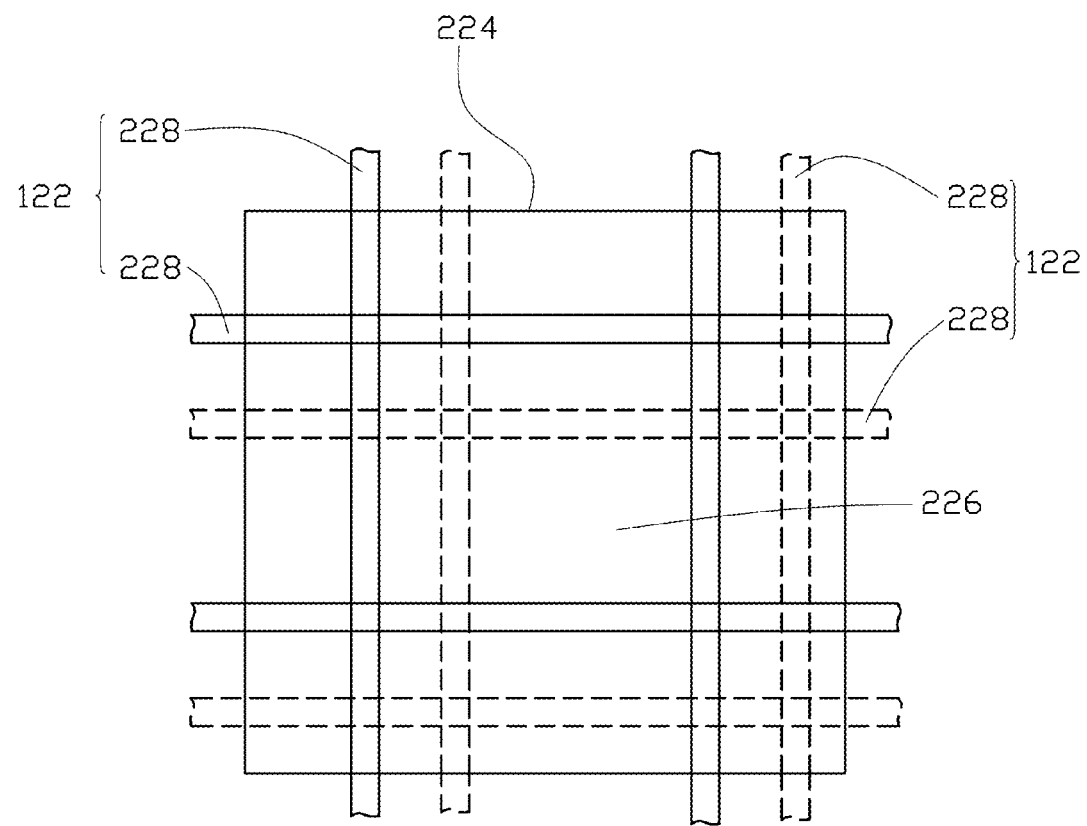
FIG. 10 shows a schematic view of one embodiment of a graphene layer-carbon nanotube film composite structure.

Referring to FIGS. 9 and 10, a TEM grid 200, which can be made by the above-described method, includes a grid 210 and a graphene layer-carbon nanotube film composite structure 220 covered on the grid 210.

The TEM grid 200 is similar to the TEM grid 100. The difference is that the graphene layer-carbon nanotube film composite structure 220 includes two carbon nanotube film structures 222 and a graphene layer 224 stacked with each other. The graphene layer 224 is sandwiched between the two adjacent carbon nanotube film structures 222. The graphene layer 224 can be held by two carbon nanotube film structures 222 firmly.

The graphene layer-carbon nanotube film composite structure 220 can be located on the grid 210. The portions of graphene layer-carbon nanotube film composite structure 220 can be suspended across the through holes 212 in the grid 210. The graphene layer 224 can cover a plurality of pores 226 in the carbon nanotube film structure 222. The plurality of pores 226 are defined by the intercrossed carbon nanotube strings 228 in the carbon nanotube film structure 222. The carbon nanotube strings 228 in the two adjacent carbon nanotube film structures 222 can firmly secure the graphene layer 224.

The graphene layer-carbon nanotube film composite structure 220 includes two carbon nanotube film structures 222 and a graphene layer 224 sandwiched between the two carbon nanotube film structures 222. Thus, the TEM grid 200 can have a stable structure and can be more durable.

The above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a transmission electron microscope grid, the method comprising:
    (a) providing a substrate with a graphene layer on a surface of the substrate;
    (b) applying a carbon nanotube film structure to cover the graphene layer;
    (c) removing the substrate, to obtain a graphene layer-carbon nanotube film composite structure, and placing a second carbon nanotube film structure on the graphene layer-carbon nanotube film composite structure to form a three layers structure, wherein the graphene layer is sandwiched between the two carbon nanotube film structures in the three layers structure; and
    (d) placing the three layers structure on a grid.

2. The method of claim 1, wherein each carbon nanotube film structure comprises at least two stacked carbon nanotube films, and adjacent carbon nanotube films are aligned along different directions.

3. The method of claim 2, wherein each carbon nanotube film comprises a plurality of carbon nanotubes, the plurality of carbon nanotubes in the carbon nanotube film are joined end-to-end by van der Waals force therebetween.

4. The method of claim 3, wherein the plurality of carbon nanotubes define at least one pore, and the at least one pore is covered by the graphene layer.

5. The method of claim 1, wherein the graphene layer and carbon nanotube film structure of the three layers structure are joined by $sp^3$ bonds therebetween.

6. The method of claim 1, wherein the substrate is selected from the group consisting of metal foil, alloy foil, and metallic oxide foil.

7. The method of claim 1, wherein step (b) comprises a substep of treating the carbon nanotube film structure on the graphene layer of the substrate with an organic solvent.

8. The method of claim 1, wherein step (c) comprises a substep of immersing the substrate with the carbon nanotube film structure on the graphene layer into a treatment fluid to remove the substrate.

9. The method of claim 8, wherein the treatment fluid is selected from the group consisting of acid solution, alkali solution, and salt solution.

10. The method of claim 1 wherein step (c) comprises a substep of irradiating the three layers structure with a laser or an ultraviolet beam to form a plurality of $sp^3$ bonds between the graphene layer and the two carbon nanotube film structures.

11. The method of claim 1 wherein step (c) comprises a substep of bombarding the three layers structure with high-energy particles to form a plurality of $sp^3$ bonds between the graphene layer and the two carbon nanotube film structures.

12. The method of claim 1 wherein step (d) comprises a substep of treating the three layers structure located on the grid with an organic solvent to tightly adhere the three layers structure with the grid.

13. A method for making more than one transmission electron microscope grid, comprising:
    (a) providing a substrate with a graphene layer on a surface of the substrate;
    (b) applying a carbon nanotube film structure to cover the graphene layer;
    (c) removing the substrate, to obtain a graphene layer-carbon nanotube film composite structure, and placing a second carbon nanotube film structure on the graphene layer-carbon nanotube film composite structure to form a three layers structure, wherein the graphene layer is sandwiched between the two carbon nanotube film structures in the three layers structure;
    (d) arranging a plurality of grids spaced from each other on a platform;
    (e) covering the plurality of grids with the three layers structure; and
    (f) cutting the three layers structure corresponding to the plurality of grids.

14. The method of claim 13, further comprising a step of removing excess portions of the three layers structure outside the plurality of grids.

15. The method of claim 14, wherein the step of removing the excess portions of the three layers structure comprises a step of focusing a laser beam on the excess portions of the three layers structure.

16. The method of claim 1, further comprising a step of treating the graphene layer-carbon nanotube film composite structure with a cleaning liquid, and the cleaning liquid is selected from the group consisting of dilute sulfuric acid, dilute nitric acid and dilute hydrochloric acid.

17. The method of claim 16, wherein the step of treating the graphene layer-carbon nanotube film composite structure with a cleaning liquid comprises a step of immersing the entire graphene layer-carbon nanotube film composite structure into the cleaning liquid for about 1 minute to about 15 minutes.

18. The method of claim 16, further comprising a step of applying a de-ionized water to wash away the cleaning liquid remained in the graphene layer-carbon nanotube film composite structure.

* * * * *